(12) United States Patent
Glibbery

(10) Patent No.: US 9,054,690 B2
(45) Date of Patent: Jun. 9, 2015

(54) CHOPPED OSCILLATOR

(71) Applicant: Adam Glibbery, Reading (GB)

(72) Inventor: Adam Glibbery, Reading (GB)

(73) Assignee: ANALOG DEVICES GLOBAL, Hamilton (BM)

( * ) Notice: Subject to any disclaimer, the term of this patent is extended or adjusted under 35 U.S.C. 154(b) by 87 days.

(21) Appl. No.: 13/789,449

(22) Filed: Mar. 7, 2013

(65) Prior Publication Data

US 2014/0062596 A1    Mar. 6, 2014

Related U.S. Application Data

(60) Provisional application No. 61/694,381, filed on Aug. 29, 2012.

(51) Int. Cl.
| | | |
|---|---|---|
| H03K 3/0231 | (2006.01) | |
| H03K 3/36 | (2006.01) | |
| H03F 3/45 | (2006.01) | |
| H03K 4/06 | (2006.01) | |

(52) U.S. Cl.
CPC .............. *H03K 3/36* (2013.01); *H03F 3/45179* (2013.01); *H03K 3/0231* (2013.01); *H03F 3/45183* (2013.01); *H03F 2203/45561* (2013.01); *H03F 2203/45614* (2013.01); *H03F 2203/45616* (2013.01); *H03F 2203/45641* (2013.01); *H03F 2203/45644* (2013.01); *H03F 2203/45724* (2013.01); *H03F 2203/45726* (2013.01); *H03K 4/06* (2013.01)

(58) Field of Classification Search
CPC ....... H03K 3/023; H03K 3/0231; H03K 3/03; H03K 4/12; H03K 4/50; H03K 4/501; H03K 4/502

USPC ........................... 331/111, 143, 153; 327/182
See application file for complete search history.

(56) References Cited

U.S. PATENT DOCUMENTS

| | | | | |
|---|---|---|---|---|
| 5,508,664 | A * | 4/1996 | Rizzo .............................. | 331/111 |
| 5,793,257 | A * | 8/1998 | Inanami et al. .................. | 331/17 |
| 5,952,849 | A | 9/1999 | Haigh | |
| 6,825,735 | B2 * | 11/2004 | Chung .......................... | 331/135 |
| 6,873,065 | B2 | 3/2005 | Haigh et al. | |
| 7,053,724 | B2 * | 5/2006 | Rusu et al. ..................... | 331/143 |
| 7,075,329 | B2 | 7/2006 | Chen et al. | |
| 7,135,937 | B2 * | 11/2006 | Mitsuda ......................... | 331/143 |
| 7,466,178 | B2 * | 12/2008 | Mirow ........................... | 327/227 |
| 8,054,141 | B2 * | 11/2011 | Saw .............................. | 331/111 |
| 8,253,468 | B2 * | 8/2012 | Nakagawara .................. | 327/291 |
| 8,310,319 | B2 * | 11/2012 | Liu et al. ...................... | 332/109 |
| 8,350,631 | B1 * | 1/2013 | Wadhwa et al. .............. | 331/111 |
| 8,363,431 | B2 * | 1/2013 | Lin et al. ..................... | 363/21.18 |
| 8,692,625 | B2 * | 4/2014 | Sinitsky et al. ............... | 331/143 |
| 2007/0146087 | A1 * | 6/2007 | Hwang et al. ................. | 331/111 |

OTHER PUBLICATIONS

Analog Devices, Inc., "Isolated Sigma-Delta Oscillator", AD7400 Data Sheet, Rev. F, Mar. 2012.

* cited by examiner

*Primary Examiner* — Levi Gannon
(74) *Attorney, Agent, or Firm* — Kenyon & Kenyon LLP

(57) ABSTRACT

Embodiments of the present disclosure may provide a relaxation oscillator with improved performance against phase noise error. The phase noise error may be reduced from sources whose power is greater at lower frequencies. To reduce the noise error, the relaxation oscillator may include chopping in the charging current driver; chopping in the trigger level generator; and/or chopping in the currents that feed the cells. A chopped amplifier may be provided to perform chopping of the input signals.

18 Claims, 6 Drawing Sheets

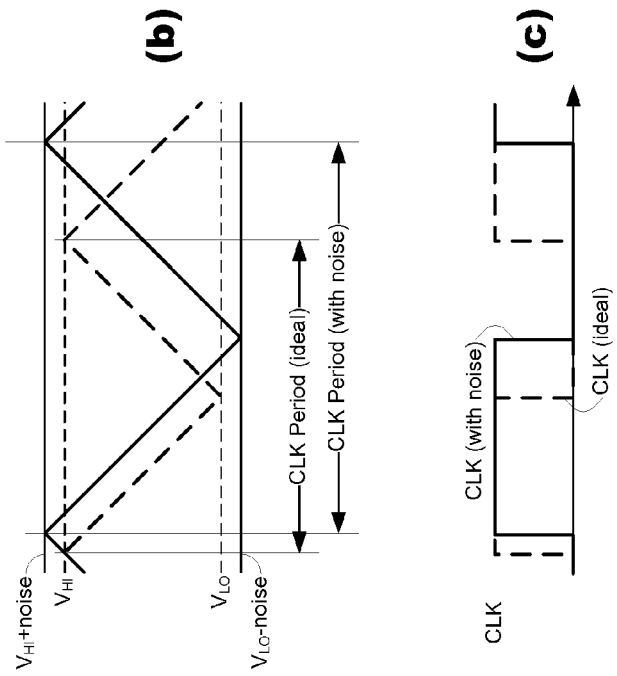
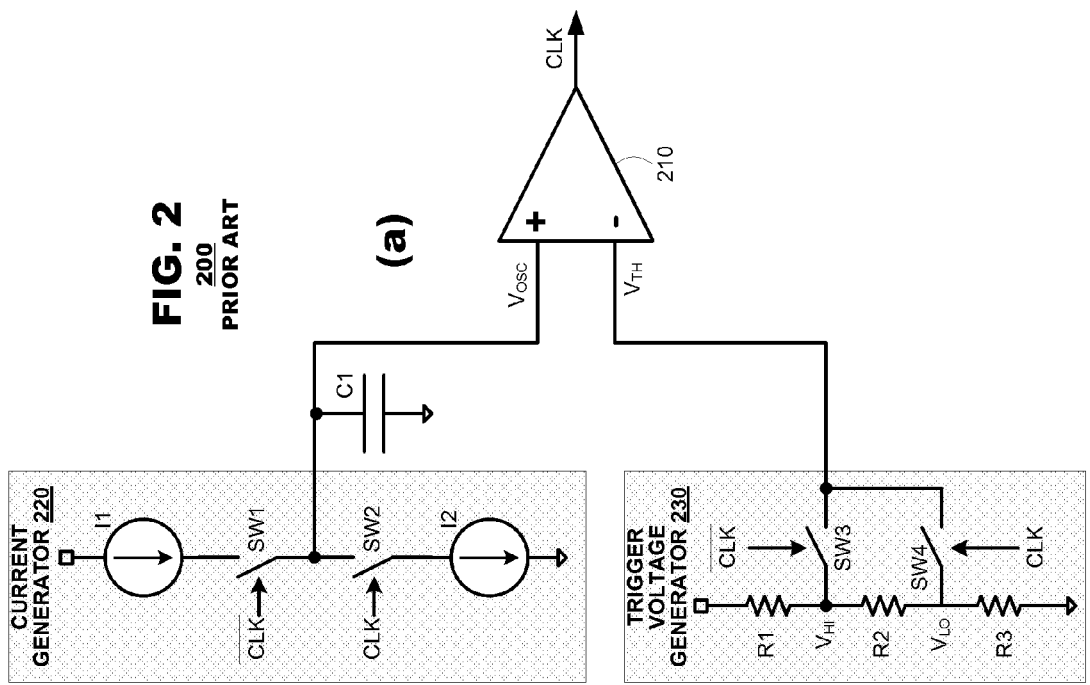
FIG. 2
200
PRIOR ART

300

400

500

600

CHOPPED OSCILLATOR

CROSS-REFERENCE TO RELATED APPLICATION

This application claims the benefit of priority afforded by U.S. Provisional Application Ser. No. 61/694,381, filed Aug. 29, 2012 the entirety of which is incorporated by reference herein.

BACKGROUND

The subject matter of this application is directed to a relaxation oscillator, and more particularly to a chopped relaxation oscillator with local comparator biasing.

FIG. 1 illustrates processes involved in a signal sampling system 100 that includes a signal source 110 and a sample and hold ("S/H") circuit 120. The signal source 110 generates a continuous time signal such as the signal illustrated in FIG. 1(b). The S/H circuit 120 may sample the input signal at times as determined by a driving clock signal CLK. Typically, the sampling times are determined by rising and/or falling edges of the CLK signal. The S/H circuit 120 holds the sampled signal value for processing by other circuits within the system, for example, an analog-to-digital converter 130, until the CLK signal defines another sampling instant. For the input signal shown in FIG. 1(b), the S/H circuit 120 might generate an output signal as shown in FIG. 1(c).

Ideally, the CLK signal defines sampling events that occur at precisely defined intervals that are uniformly spaced. The CLK signal may be generated by an oscillator (e.g., a relaxation oscillator that uses charge and discharge time of a capacitor). However, random processes that exist within practical implementations will move these sampling instances. This error is referred to as phase noise.

The uncertainty in the absolute time of any edge coming out of a clock source is the sum of all the uncertainties in the clock periods that provide this edge. Any error source that modifies a period of the clock source will be integrated when considering the absolute timebase accuracy. If a sinusoid is sampled with the signal sampling system 100, then in the frequency domain the sampled signal will be smeared by the uncertainty of the timebase. While most of the smeared energy will be found near the ideal location of the energy, some of the smeared energy will be further away from the ideal location. Error sources having more energy at low frequencies, will introduce more uncertainty in the timebase at low frequencies and will increase the sinusoidal smearing. Reducing these low frequency error sources would provide better on chip clock sources.

Accordingly, there is a need in the art for relaxation oscillators that reduce the phase noise.

BRIEF DESCRIPTION OF THE DRAWINGS

So that features of the present invention can be understood, a number of drawings are described below. It is to be noted, however, that the drawings illustrate only particular embodiments of the disclosure and are therefore not to be considered limiting of its scope, for the invention may encompass other equally effective embodiments.

FIGS. 2(a)-2(c) illustrate structure and operation of a relaxation oscillator.

DETAILED DESCRIPTION

Figure 1:
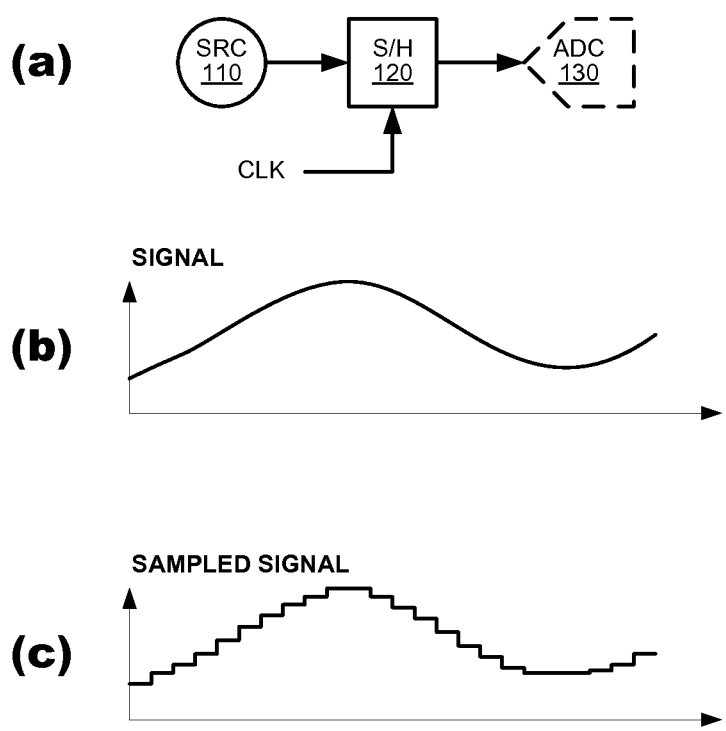
FIG. 1 illustrates processes involved in a signal sampling system that includes a signal source and a sample and hold ("S/H") circuit.

Embodiments of the present disclosure may provide a relaxation oscillator with improved performance against phase noise error and reduce the smearing seen in the sampled signal. In particular, the phase noise error may be reduced from sources whose power is greater at lower frequencies. To reduce the phase noise error and/or smearing in the sampled signal, the relaxation oscillator may include chopping in the charging current driver, chopping in the trigger level generator, and/or chopping in the currents that feed the cells. A chopped amplifier may be provided to perform chopping of the input signals.

FIG. 2 illustrates structure and operation of a relaxation oscillator 200 that may include one or more chopping circuits. The relaxation oscillator 200 may use the charge and discharge times of a capacitor to generate a clock signal CLK. The relaxation oscillator 200 may include a capacitor C1 that is charged and discharged during operation, a comparator 210 that compares an input oscillation signal $V_{OSC}$ from the capacitor C1 to a threshold voltage $V_{TH}$, a trigger voltage generator 230 to provide the threshold voltage $V_{TH}$, and a current generator 220 that provides current to the capacitor C1 to charge and discharge the capacitor C1. The relaxation oscillator 200 may perform chopping in the current generator 220, in the trigger voltage generator 230 and/or the currents that feed the current generator 220 and the trigger voltage generator 230. The chopping may interrupt and/or switch currents provided by the current source or signals generated within the circuits.

The current generator 220 may include a pair of current sources I1, I2 connected to the capacitor C1 by respective coupling switches SW1, SW2. When SW1 is closed, current source I1 charges the capacitor C1 at a predetermined rate. When SW2 is closed, current source I2 discharges the capacitor C1 at a predetermined rate (ideally, equal but opposite to the rate at which I1 charges the capacitor C1). Including two current sources I1 and I2 in the current generator 220 provides two switchable paths that may reduce the noise components. While FIG. 2(a) illustrates the current generator 220 including two current sources I1, I2, other arrangements of one or more current sources may be used to charge and discharge the capacitor C1. For example, a single current source (e.g., current source I2) may be used to charge and discharge the capacitor C1.

The trigger voltage generator 230 may provide a threshold voltage to the comparator 210. The trigger voltage generator 230 may include a voltage divider network formed by a plurality of resistors (e.g., three resistors R1, R2, R3) that is coupled to the comparator 210 by coupling switches SW3, SW4. When switch SW3 is closed, the comparator's input is coupled to a high voltage level ($V_{TH}=V_{HI}$) generated within the voltage divider network. When switch SW4 is closed, the comparator's $V_{TH}$ input is coupled to a low voltage level ($V_{TH}=V_{LO}$) generated within the voltage divider network.

FIGS. 2(b)-(c) illustrate signals generated by the relaxation oscillator. Voltages $V_{OSC}$, $V_{HI}$ and $V_{LO}$ are illustrated in FIG. 2(b). The CLK output is shown in FIG. 2(c). Ideal operation is shown in phantom lines and one possible variant of actual operation in the presence of noise is shown in solid lines.

Ideally, the capacitor voltage would be compared directly to the $V_{HI}$ and $V_{LO}$ thresholds, which would generate a 50% duty cycle clock at a predetermined clock period. In practice, however, the resistor devices within the voltage divider network generate frequency dependent noise, which causes the $V_{HI}$ and $V_{LO}$ voltages as used by the comparator 210 to vary from ideal levels. FIG. 2(b) illustrates such errors schematically.

If the noise causes the $V_{HI}$ voltage as input to the comparator to exceed the ideal level of $V_{HI}$, then, working from a common starting point, the capacitor voltage $V_{OSC}$ would toggle the comparator 210 at a time later than is ideal. If the noise causes the $V_{LO}$ voltage, as input to the comparator to be lower than the ideal level of $V_{LO}$, then the capacitor voltage $V_{OSC}$ would toggle the comparator 210 at a time later than is ideal.

FIG. 2(b) illustrates only one possible scenario involving noise effects. In one instance noise effects can cause the $V_{TH}$ as used by the comparator 210 to be lower than the ideal $V_{TH}$ and/or can cause the $V_{LO}$ as used by the comparator 210 to be higher than the ideal $V_{LO}$. Thus, noise effects can cause the CLK signal to run either faster or slower than the ideal case. Because the phase error continually accumulates this source of error, then a 1/f^n noise process would result in a phase error whose magnitude varies with frequency with a 1/f^(n+2) characteristic.

To reduce the noise effects, embodiments of the present disclosure include providing a chopping circuit (not shown in FIG. 2(a)) in one or more of the current generator 220, the trigger voltage generator 230, and/or currents that feed the current generator 220 and/or the trigger voltage generator 230. The chopping circuit may interrupt and/or switch the signals generated within the current generator 220 or the trigger voltage generator 230. Inverting the effects of different noise sources via the chopping circuit within the current generator 220 and/or the trigger voltage generator 230 for half the time may cancel their effect on the final sampled system. The chopping circuit may invert the effect of the noise sources for each phase of a CHOP signal.

Figure 3:
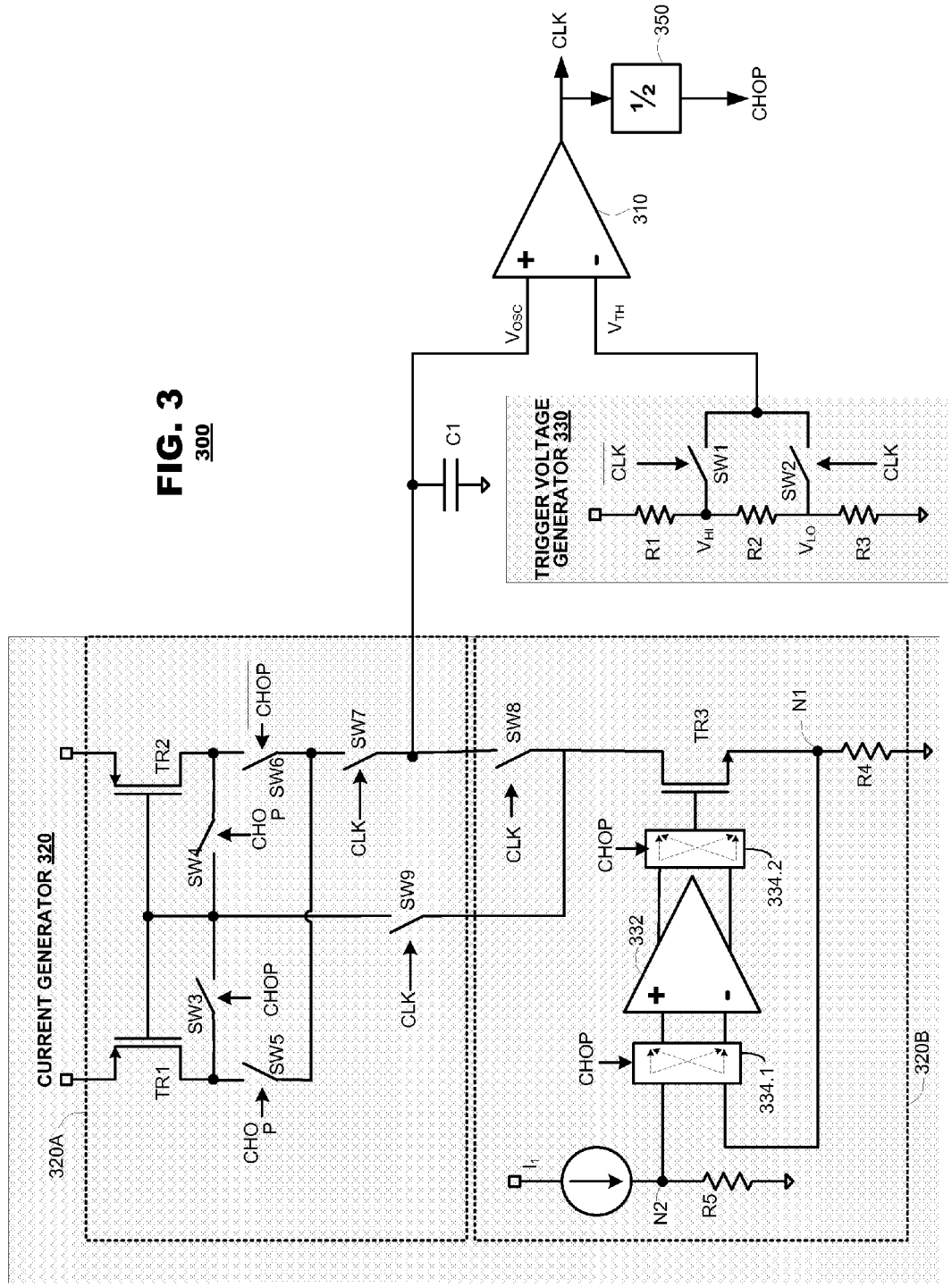
FIG. 3 illustrates a relaxation oscillator according to another embodiment of the present invention.

FIG. 3 illustrates a relaxation oscillator 300 according to an embodiment of the present invention. To reduce the noise effects in the relaxation oscillator 300, chopping may be performed in the current generator 320. The chopping may be performed in the circuit supplying the current to the capacitor C1 and/or the circuit draining the current from the capacitor C1.

The relaxation oscillator 300 may include a capacitor C1 that is charged and discharged during operation, a comparator 310 that receives a $V_{OSC}$ signal from the capacitor C1 and a $V_{TH}$ voltage, a trigger voltage generator 330 that supplies $V_{TH}$ voltage in response to a CLK signal, and a current generator 320 that selectively supplies current to the capacitor C1 or drains current from the capacitor C1 in response to a CLK signal output from the comparator 310. The relaxation oscillator 300 may include a clock divider 350 that divides the CLK signal by half to generate a CHOP signal. The CHOP signal may be used to control the chopping in the current generator 320.

The trigger voltage generator 330 may be formed by three resistors R1, R2, R3 that is coupled to the comparator 310 by coupling switches SW1, SW2. When switch SW1 is closed, the $V_{TH}$ input is coupled to a high voltage level ($V_{TH}=V_{HI}$) generated within the voltage divider. When switch SW2 is closed, the $V_{TH}$ input is coupled to a low voltage level ($V_{TH}=V_{LO}$) generated within the voltage divider.

The current generator 320 may supply current to the capacitor C1 during a charging phase of operation and may drain current from the capacitor C1 during a draining phase of operation. The current generator 320 may include a first chopped current mirror configuration 320A to supply current to the capacitor C1 and a second chopped current source 320B to drain current from the capacitor C1.

The first chopped current mirror configuration 320A may include a pair of transistors TR1, TR2 and a plurality of switches (e.g., switches SW3, SW4, SW5, SW6, SW7 and SW9) controlling the supply of current via the transistors TR1, TR2. Each transistor TR1, TR2 can be configured to supply current to the capacitor C1 in a separate phase of the CHOP signal. The gate of each transistor TR1, TR2 may be connected to its drain via a respective connecting switch SW3, SW4. The drain of each transistor TR1, TR2 may be coupled to the capacitor C1 via a respective connecting switch SW5, SW6. The current used to charge the timing capacitor C1 is coupled through SW7 when needed.

The switches can be driven by CHOP and CHOP control signals such that, in a first phase of operation (e.g., when CHOP=1), a first transistor (TR1) outputs current to the capacitor C1 (via switch SW5) while the gate of the other transistor (TR2) is connected to its own drain via switch SW4, thus setting the gate voltage of the first transistor (TR1). In a second phase of operation (e.g., when CHOP=0), the second transistor (TR2) outputs current to the capacitor C1 (via switch SW6) while the gate of the first transistor (TR1) is connected to its own drain via switch SW3. The error produced may cancel when seen in average because in the first phase of operation (e.g., when CHOP=1) the output will see a negative version of the errors that are seen in the second phase of operations (e.g., when CHOP=0). The first chopped current mirror may be connected to the charging capacitor C1 via switch SW7 during a predetermined phase of the CLK signal ($\overline{CLK}$).

The second chopped current source 320B may drain current from the capacitor C1 during a second phase of the CLK signal. The second chopped current source 320B may be connected to the charging capacitor C1 via a connecting switch SW8 during a predetermined phase of the CLK signal (CLK). The second chopped current source 320B may include a transistor TR3, a resistor R4, an amplifier 332, a chop circuit 334.1, 334.2, a current source I1 and biased resistor R5.

The transistor TR3 may have a source to drain path that connects the capacitor C1 to ground (via a resistor R4). The voltage at an intermediate node N1 between transistor TR3 and resistor R4 may vary based on the gate voltage of the transistor TR3 and the voltage on the capacitor C1. The current source I1 and the biased resistor R5 may generate a reference voltage at an intermediate node N2 between them. The amplifier 332 may generate a control signal to the transistor TR3 based on a comparison of voltages present on the N1, N2 nodes. The amplifier 332, which may be a differential in, differential out amplifier, may provide a differential output based on the comparison of voltages present on the N1, N2 nodes. The current used to discharge the timing capacitor C1 is coupled to it through SW8 when needed. The chop circuit 334.1 may change the orientation of the N1, N2 voltages as input to the amplifier 332 based on the CHOP signal, along with reversing the input terminals of the amplifier 332. The chop circuit 334.2 may receive the differential output of the amplifier 332 and provide a single ended stage to the transistor TR3. The chop circuit 334.2 may switch the orientation of the differential output provided by the amplifier 332. The closed high gain loop may cause any noise sources to be dropped across the linear resistor R4. By inverting these each chop cycle, the linear nature of R4 may cause the low frequency source to cancel on average. The amplifier 332 and the chop circuit 334.1, 334.2 provide the second chopped current mirror 320B with a reference current through SW9 while C1 is being charged, so that the current pulling up capacitor C1 is fully chopped without requiring a further mirror. While a differential in, differential out amplifier is shown in FIG. 3, an amplifier with a single ended output may be directly used as a control signal to the transistor TR3. A differential to single ended stage may be provided at the outputs of the amplifier 332.

Either the CLK signal or the CHOP control signals can be used as a clock source, the chopping being invisible on the CHOP control signal. The CLK signal may be used for clocking lower frequencies.

Figure 4:
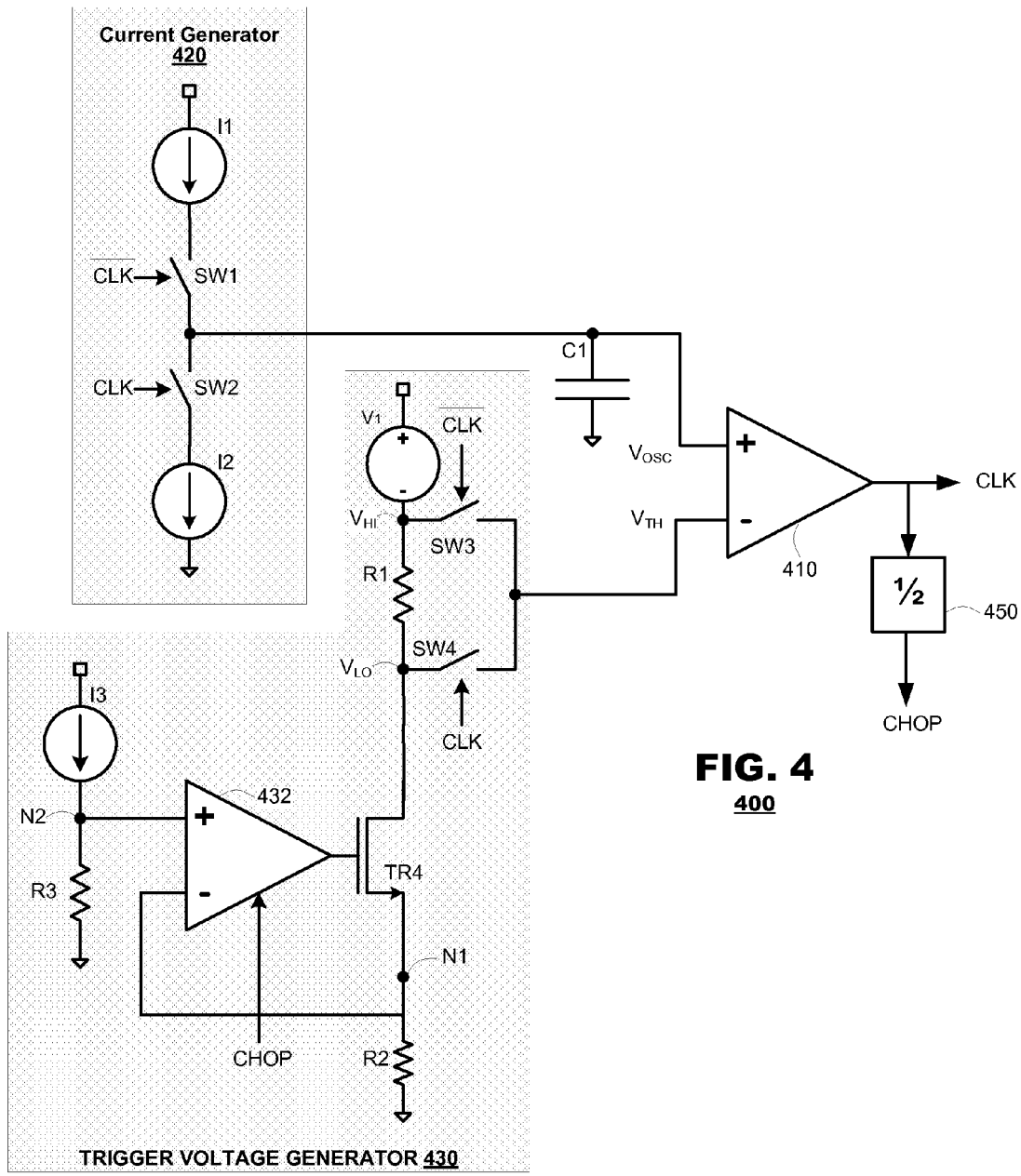
FIG. 4 illustrates a relaxation oscillator according to another embodiment of the present invention.

FIG. 4 illustrates a relaxation oscillator 400 according to another embodiment of the present invention. To reduce the noise effects in the relaxation oscillator 400, chopping may be performed in the trigger voltage generator 430. The chopping may be included in the circuit supplying the reference voltage $V_{TH}$ to the comparator 410.

The relaxation oscillator 400 may include a capacitor C1 that is charged and discharged during operation, a comparator 410 that receives a $V_{OSC}$ signal from the capacitor C1 and a $V_{TH}$ voltage, a trigger voltage generator 430 that supplies $V_{TH}$ voltage in response to a CLK signal, and a current source 420 that selectively supplies current to the capacitor C1 or drains current from the capacitor C1 in response to a CLK signal output from the comparator 410. The relaxation oscillator 400 may include a clock divider 450 that divides the CLK signal by half to generate a CHOP signal. The CHOP signal may be used to control the chopping in the trigger voltage generator 430.

The current generator 420 may include a pair of current sources I1, I2 connected to the capacitor C1 by respective coupling switches SW1, SW2. When SW1 is closed, current source I1 may charge the capacitor C1 at a predetermined rate. When SW2 is closed, current source I2 may discharge the capacitor C2 at a predetermined rate (ideally, equal but opposite to the rate at which I1 charges the capacitor C1).

The trigger voltage generator 430 may supply the $V_{TH}$ voltage in response to a CLK signal. The trigger voltage generator 430 may provide a plurality of different voltage values to the comparator 410 in response to a CLK signal. For example, during each cycle or phase of the clock a different voltage value may be provided to the comparator 410.

The trigger voltage generator 430 may include a voltage source V1 to provide a $V_{HI}$ threshold to the comparator 410, and a chopped resistive mirror to supply a $V_{LO}$ threshold to the comparator 410. The voltage source V1 may provide the $V_{HI}$ threshold to the comparator 410 when switch SW3 is closed in response to a control signal (e.g., CLK signal). The chopped resistive mirror may supply the $V_{LO}$ threshold to the comparator 410 when switch SW4 is closed and switch SW3 is open. A resistor R1 may be provided between the voltage source V1 and the chopped resistive mirror.

The chopped resistive mirror may include a transistor TR4, a resistor R2, an amplifier 432, a current source I3 and a resistor R3. The switch SW4 may connect the chopped resistive mirror to the comparator 410 during a predetermined phase of the CLK signal (CLK). The transistor TR4 may have a source to drain path that connects the comparator 410 to ground (via a resistor R2). The current source I3 and biased resistor R3 may generate a reference voltage at an intermediate node N2. The amplifier 432 may generate a control signal to the transistor TR4 based on a comparison of voltages present on the N1, N2 nodes. The amplifier may include a chop circuit (not shown in FIG. 4) to change the orientation of the voltage at nodes N1, N2 as input to the amplifier 432 based on the CHOP signal. Changing the orientation of the voltage at nodes N1, N2 within the amplifier 423 may provide the error source on opposite terminals of the amplifier 432 when the CHOP signal changes. The configuration of the chop circuit 334.1 and 334.2 may be used for the chop circuit of the amplifier 432. The amplifier 432 may be a differential in, differential out amplifier.

The current source I3 applied across biased resistor R3 generates a reference voltage at the intermediate node N2. The amplifier 432 and transistor TR4 can be used to force the reference voltage at node N2 to the node N1. The low frequency amplifier 432 noise can be reduced by changing the orientation of the N1, N2 voltages as input to the amplifier 432 based on the CHOP signal. The low frequency noise in the voltage source V1 may be ignored because the voltage source V1 noise does not affect the difference in trigger levels. Only the common mode voltage may not alter the clock frequency.

Figure 5:
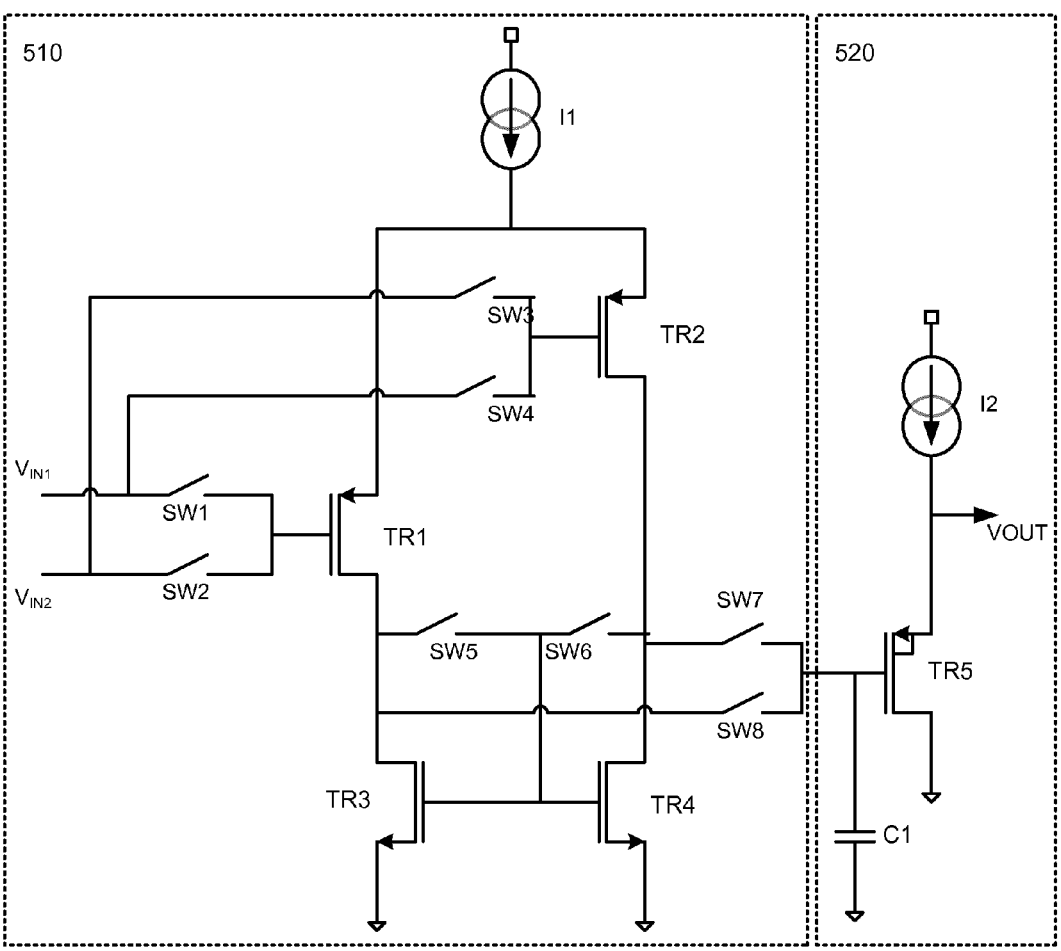
FIG. 5 illustrates a chopped amplifier according to an embodiment of the present invention.

FIG. 5 illustrates a chopped amplifier 500 according to an embodiment of the present invention. The chopped amplifier 500 may be included in the current generator 220, 320, 420 and/or the trigger voltage generator 230, 330, 430, shown in FIGS. 2(a), 3 and 4. The chopped amplifier 500 may include a chopped differential amplifier 510 and a source follower circuit 520.

The chopped differential amplifier 510 may include a chop circuit to swap the input devices TR1 and TR2 that connect to the inputs Vin1 and Vin2 based on a CHOP signal. To maintain the same ideal behavior the load presented to the differential current coming out of TR1 and TR2 is also reconfigured with the CHOP signal such that the transfer function from the differential signal Vin1-Vin2 to the single ended signal at the gate of TR5 is the same when CHOP=0 and CHOP=1. The chopped amplifier 500 may be driven by CHOP and $\overline{CHOP}$ control signals to operate various switches in the chopped amplifier 500 to change the devices that will be seen by the inputs Vin1 and Vin2. The chopped amplifier 500 may generate a control signal (VOUT) based on a comparison of the voltages (Vin1 and Vin2) input into the chopped amplifier 500. The voltages (Vin1 and Vin2) input into the chopped amplifier 500 may be compared via different transistors and current paths in each phase of the CHOP control signal.

The chopped differential amplifier 510 may include switches SW1, SW3, SW5 and SW7 to provide a path in normal mode (first phase of operation) and switches SW2, SW4, SW6 and SW8 to provide a path in chopped mode (second phase of operation). In each phase of operation, different switches may be activated to switch the inputs signals being provided to the respective transistors (e.g., TR1 and TR2) in the amplifier 500. A current source provides current to the sources of the input transistors TR1, TR2. The input transistors TR1, TR2 may be coupled to a pair of load transistors TR3, TR4 having their gates coupled together. The drain of one of the load transistors TR3, TR4 may be coupled to the source follower circuit 520.

The switches in the chopped amplifier 500 may be driven by CHOP and $\overline{CHOP}$ control signals such that, in a first phase of operation, the input Vin1 is provided to transistor TR1 and the input Vin2 is provided to transistor TR2 and in the second phase of operation the input Vin1 is provided to transistor TR2 and the input Vin2 is provided to transistor TR1. In the first phase of operation switches SW1, SW3, SW5 and SW7 can be turned on and switches SW2, SW4, SW6 and SW8 can be turned off. In the second phase of operation switches SW2, SW4, SW6 and SW8 can be turned on and switches SW1, SW3, SW5 and SW7 can be turned off. Including the chopped circuit in the amplifier 500 allows for the mismatch and low frequency errors in the first stage when referred to the inputs Vin1 and Vin2 of the chopped amplifier 500 to be changed so that they cancel in average with the second phase of the CHOP signal. The gain of the first stage causes any errors in the second stage to be greatly attenuated when referred to the input so it would not benefit from chopping.

As shown in FIG. 5, the drains of TR1 and TR3 are always connected as are the drains of TR2 and TR4 such that the error sources in TR3 can always be referred to the gate of TR1 and similarly for TR4 and TR2. This means that reconfiguring the load does not detract from the chopping action when related to the error sources in TR3 and TR4.

Switches SW7, SW8 may couple one of the drains of the load transistors TR3, TR4 to the source follower circuit 520, based on the CHOP signal. In one phase of the CHOP signal, the switch SW7 may couple the drain of the transistor TR4 to the source follower circuit 520 and in the next phase of the CHOP signal, the switch SW7 may couple the drain of the transistor TR3 to the source follower circuit 520.

The source follower circuit 520 may include a transistor TR5 and a current source I2 and may receive an input signal at the gate of the transistor TR5 and provide an output signal VOUT at the source of the transistor TR5. The transistor TR5 may receive the input signal from one of the drains of transistors TR3 or TR4 via switch SW7 or SW8. The input signal received at the gate of the transistor TR5 may be switched between the drains the drains of transistors TR3 or TR4 in each phase of the CHOP signal.

Figure 6:
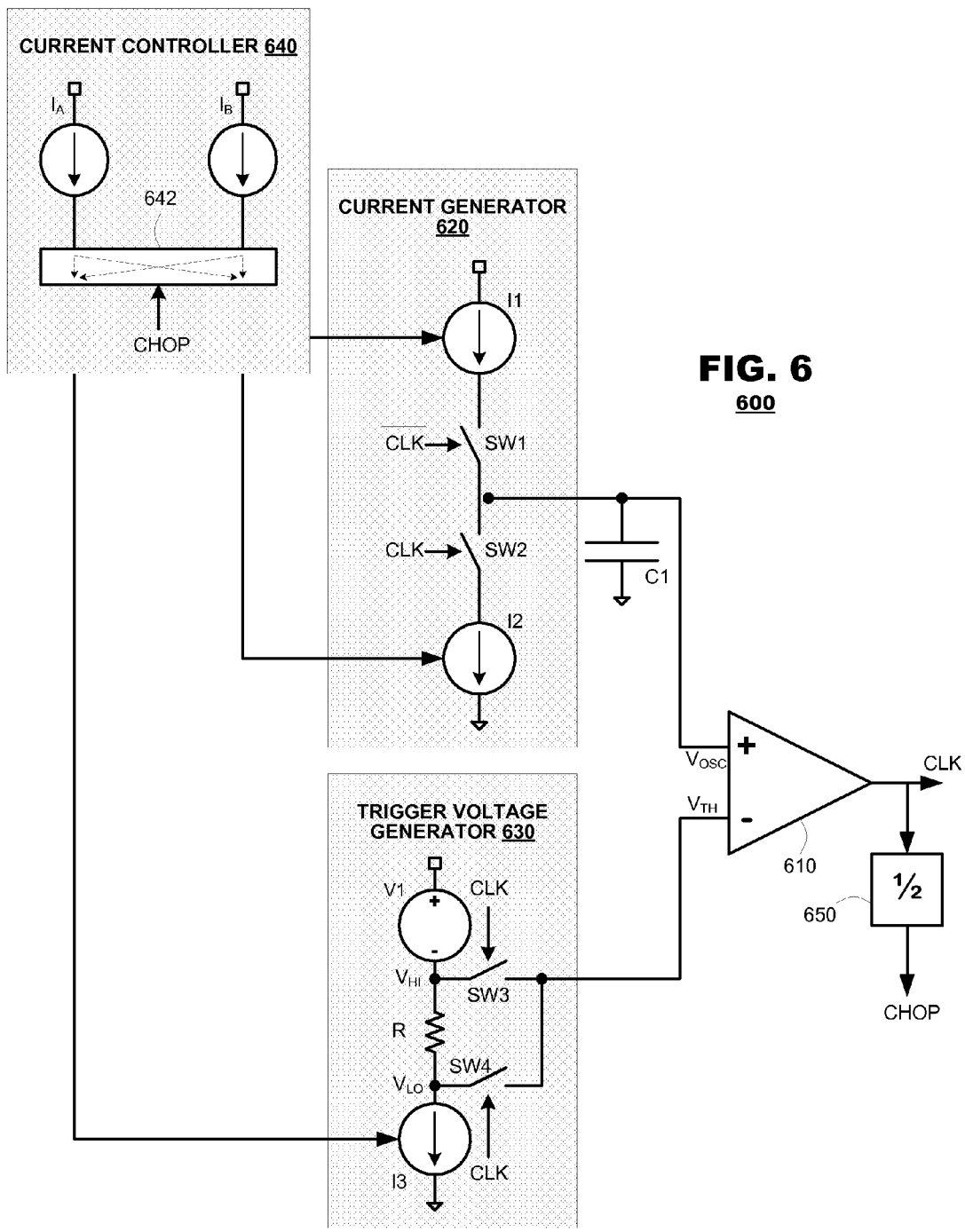
FIG. 6 illustrates a relaxation oscillator according to another embodiment of the present invention.

FIG. 6 illustrates a relaxation oscillator 600 according to another embodiment of the present invention. To reduce the noise effects in the relaxation oscillator 600, chopping may be performed in the currents that feed the current generator 620 and the trigger voltage generator 630. The chopping circuit may switch the current sources that provide current to the current generator 620 and the trigger voltage generator 630 in response to a CHOP control signal. In one phase of the CHOP signal, a first current source may be coupled to the current generator 620, while a second current source is coupled to the trigger voltage generator 630. In the next phase of the CHOP signal, the first current source may be coupled to the trigger voltage generator 630, while the second current source is coupled to the current generator 620.

The relaxation oscillator 600 may include a capacitor C1 that is charged and discharged during operation, a comparator 610 that receives a $V_{OSC}$ signal from the capacitor C1 and a $V_{TH}$ voltage, a current generator 620 that supplied and drains current to the capacitor C1, a trigger voltage generator 630 that supplies $V_{TH}$ voltage to the comparator 610, and a current controller 640 to provide currents to the current generator 620 and the trigger voltage generator 630. The relaxation oscillator 600 may include a clock divider 650 that divides the CLK signal by half to generate a CHOP signal. The CHOP signal may be used to control the chopping in the current controller 640.

The current generator 620 may selectively supply current to the capacitor C1 or drain current from the capacitor C1 in response to a CLK signal output from the comparator 610. The current generator 620 may include a pair of current sources I1, I2 connected to the capacitor C1 by respective coupling switches SW1, SW2. When SW1 is closed, current source I1 charges the capacitor C1 at a predetermined rate. When SW2 is closed, current source I2 discharges the capacitor C2 at a predetermined rate (ideally, equal but opposite to the rate at which I1 charges the capacitor C1).

The trigger voltage generator 630 may supply $V_{TH}$ voltage in response to a CLK signal. The trigger voltage generator 630 may provide a plurality of different voltage values to the comparator 610 in response to a CLK signal. The trigger voltage generator 630 may include a voltage source V1 to provide a $V_{HI}$ threshold to the comparator 610 when switch SW3 is closed in response to a control signal, a resistor R to provide a voltage drop, and a current source I3 to force a current across resistor R and provide $V_{LO}$ threshold to the comparator 610 when switch SW4 is closed in response to a control signal.

The current controller 640 may provide currents to the current generator 620 and the trigger voltage generator 630 based on the CHOP signal provided by the clock divider 650. The current controller 640 may provide a plurality of different currents to the current generator 620 and the trigger voltage generator 630 and switch the current provided to these circuits using a chopping circuit 642. The current controller 640 may include a current source $I_A$, a current source $I_B$ and a chop circuit 642 that changes orientation of the current provided by the current source $I_A$ and the current provided by the current source $I_B$. The currents provided by the current source $I_A$ and the current source $I_B$ can be changed over each chop cycle between the current generator 620 and the trigger voltage generator 630. For example, in the first phase of the CHOP signal, the current source $I_A$ may be coupled to the current generator 620, while the current source $I_B$ is coupled to the trigger voltage generator 630. In the second phase of the CHOP signal, the current source $I_A$ may be coupled to the trigger voltage generator 630, while the current source $I_B$ is coupled to the current generator 620.

The chop circuit 642 contributes to noise cancellation caused by current sources which can achieve improved immunity to noise error. By inverting the effects of the noise components of the current sources $I_A$ and $I_B$ in alternating phases of the CHOP signal, embodiments of the present invention achieve an output CLK signal that provides improved matching to an ideal CLK signal. The CHOP signal can eliminate or reduce the error in the CLK signal due to deviations of the current sources $I_A$ and $I_B$ from ideal current sources.

For example, the chop circuit 642 may compensate for error due to one of the current sources $I_A$ and $I_B$ providing a high current, by switching between the current sources $I_A$ and $I_B$. The clock provided by the relaxation oscillator 600 will be fast if the high current is supplied to the current generator 620. However, the clock provided by the relaxation oscillator 600 will be slow if the high current is supplied to the trigger voltage generator 630. The chop circuit 642 switches the currents provided to the current generator 620 and the trigger voltage generator 630 to remove the effect of the low frequency noise in the current sources $I_A$ and $I_B$ on the clock generated by the current generator 620, as the error will average to zero.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A relaxation oscillator, comprising:
    a current controller;
    a capacitor;
    a current generator, coupled to the current controller and the capacitor, providing a charging current and a discharging current to the capacitor to generate a capacitor voltage;
    a trigger voltage generator, coupled to the current controller, providing a threshold voltage;
    a comparator providing a clock signal based on comparison of the capacitor voltage and the threshold voltage;
    a plurality of chopping circuits performing current mirroring operations that average low frequency noise generated respectively in the current controller, the current generator, and the trigger voltage generator; and
    a clock divider that divides the clock signal by half to generate a chop signal for the plurality of chopping circuits.

2. The relaxation oscillator of claim 1, wherein one of the chopping circuit includes a chopped current mirror and a chopped current source, the chopped current mirror includes:
    a pair of transistors, including a first and second transistor, arranged in a current mirror configuration; and
    a plurality of switches controlled by the chop signal to provide the charging current to the capacitor via the first transistor in a first phase of the chop signal and to provide the charging current to the capacitor via the second transistor in a second phase of the chop signal.

3. The relaxation oscillator of claim 2, wherein the chopped current source provides current to the chopped current mirror.

4. The relaxation oscillator of claim 2, wherein:
    the chopped current source provides current to the chopped current mirror during a first phase of the clock signal when the chopped current mirror provides the charging current to the capacitor; and
    the chopped current source provides the discharging current to the capacitor in the second phase of the clock signal.

5. The relaxation oscillator of claim 2, wherein the chopped current source includes:
    a third transistor having a source to drain path that connects the capacitor to ground via a resistor;
    a current source and a bias resistor providing a reference voltage;
    an amplifier that provides differential outputs used to provide a control signal to a gate of the third transistor based on a comparison of the voltage at the source of the third transistor and the reference voltage provided at inputs of the amplifier;
    a first chop circuit that changes the two voltages that are provided to the inputs of the amplifier; and
    a second chop circuit that receives the differential outputs from the amplifier and outputs the control signal to the gate of the third transistor, the second chop circuit switching the orientation of the differential outputs.

6. The relaxation oscillator of claim 2, wherein:
    in a first phase of the clock signal, the chopped current mirror provides the charging current to the capacitor; and
    in a second phase of the clock signal, the chopped current source provides the discharging current to the capacitor.

7. The relaxation oscillator of claim 2, wherein the trigger voltage generator includes a first voltage source to provide a first threshold voltage and a chopped resistive mirror to provide a second threshold voltage.

8. The relaxation oscillator of claim 1, further comprising:
    a trigger voltage generator including a first voltage source to provide a voltage source to provide a first trigger voltage;
    wherein one of the chopping circuit includes a chopped resistive mirror to provide a second trigger voltage,
    and wherein the threshold voltage is one of the first and second trigger voltages.

9. The relaxation oscillator of claim 8, wherein the chopped resistive mirror includes:
    a first switch to connect the chopped resistive mirror to the comparator;
    a transistor having a drain coupled to the first switch and a source coupled to a ground via a first resistor;
    an amplifier that provides differential outputs used to provide a control signal to a gate of the transistor based on a comparison of the voltage at the source of the transistor and a reference voltage provided at inputs of the amplifier;
    a first chop circuit that changes the two voltages that are provided to the inputs of the amplifier; and
    a second chop circuit that receives the differential outputs from the amplifier and outputs the control signal to the gate of the transistor, the second chop circuit switching the orientation of the differential outputs.

10. The relaxation oscillator of claim 1, further comprising:
a trigger voltage generator providing a first trigger voltage and a second trigger voltage,
wherein the threshold voltage includes the first and second trigger voltages, and
wherein one of the chopping circuit includes a current controller including a first current source, a second current source and a chop circuit coupling one of the current sources to the current generator and coupling the other current source to the trigger voltage generator.

11. The relaxation oscillator of claim 10, wherein:
in a first phase of the chop signal, the chop circuit couples the first current source to the current generator and the second current source to the trigger voltage generator; and
in a second phase of the chop signal, the chop circuit couples the second current source to the current generator and the first current source to the trigger voltage generator.

12. A method for providing a clock, comprising:
providing a plurality of source currents;
based on at least one of the plurality of source currents, providing a charging current and a discharging current to a capacitor to generate a capacitor voltage;
generating a plurality of trigger voltages;
comparing the capacitor voltage and a respective trigger voltage;
generating a clock signal based on the comparison, wherein the source currents, charging current, the discharging current and the trigger voltages include a respective error source that causes a change in period of the clock signal;
performing current mirroring operations that average low frequency noise generated in the error sources; and
adjusting the period of the clock signal to compensate for change in the period due to the error sources in an opposite direction on the alternating cycles.

13. The method of claim 12, further comprises:
during each phase of the clock signal, changing circuit components used to provide at least one of the charging current and the discharging current.

14. The method of claim 12, further comprising changing circuit components used to provide at least one of the trigger voltages during each phase of the clock signal.

15. The method of claim 12, further comprises:
providing the charging current and the discharging current to the capacitor using one of a first current source and a second current source;
providing at least one of the trigger voltages using the other of the first current source and the second current source;
in each phase of a divided clock signal, switching the current used to provide the charging current and the discharging current with the current that is used to provide at least one of the trigger voltages.

16. A circuit, comprising:
a current controller;
a capacitor;
a current generator, coupled to the current controller and the capacitor, to generate a charging current and a discharging current to the capacitor;
a trigger voltage generator, coupled to the current controller, to generate a plurality of trigger voltages;
a comparator to provide a clock signal based on comparison of capacitor voltage and a respective trigger voltage, wherein the current controller, the current generator, and the trigger voltage generator include error sources that causes a change in period of the clock signal;
means for performing current mirroring operations that average low frequency noise generated in the error sources and adjusting the period of the clock signal to compensate for change in the period due to the error sources in an opposite direction on the alternating cycles.

17. The circuit of claim 16, further comprises:
means for changing circuit components, during each phase of the clock signal, to provide at least one of the charging current and the discharging current.

18. The circuit of claim 16, further comprises:
means for changing circuit components to provide at least one of the trigger voltages during each phase of the clock signal.

* * * * *